United States Patent [19]

Ishikawa et al.

[11] Patent Number: 5,497,495
[45] Date of Patent: Mar. 5, 1996

[54] COMPUTER ELECTRONIC SYSTEM HAVING A COVER FOR EVERY MODULE

[75] Inventors: Tetsuo Ishikawa; Shigeru Oomori; Daijiro Hashimoto; Toshihiro Mochiduki; Satoshi Takano, all of Kawasaki, Japan

[73] Assignee: Fuji Electric Co., Ltd., Kawasaki, Japan

[21] Appl. No.: 371,889

[22] Filed: Jan. 12, 1995

Related U.S. Application Data

[63] Continuation of Ser. No. 879,024, May 6, 1992, abandoned.

[30] Foreign Application Priority Data

May 7, 1991 [JP] Japan .................... 3-101626

[51] Int. Cl.⁶ .................... G06F 1/26; H05K 5/04; H05K 7/18; H05K 7/20
[52] U.S. Cl. ................ 395/750; 364/273.5; 364/DIG. 1; 361/721; 361/736; 361/748
[58] Field of Search .................... 361/600, 692, 361/721, 717, 748, 736; 395/325, 750

[56] References Cited

U.S. PATENT DOCUMENTS

| | | | |
|---|---|---|---|
| 3,566,190 | 2/1971 | Huebner et al. | 361/383 |
| 4,454,566 | 6/1984 | Coyne | 361/721 |
| 4,498,119 | 2/1985 | Cronin | 361/721 |
| 4,656,559 | 4/1987 | Fathi | 361/386 |
| 4,769,557 | 9/1988 | Houf et al. | 307/147 |
| 4,851,615 | 7/1989 | Butt | 174/250 |
| 4,905,123 | 2/1990 | Windle et al. | 361/710 |
| 5,014,159 | 5/1991 | Butt | 361/717 |
| 5,019,938 | 5/1991 | Sridharan et al. | 361/674 |
| 5,021,763 | 6/1991 | Obear | 340/407 |
| 5,038,308 | 8/1991 | Le et al. | 364/708 |
| 5,060,115 | 10/1991 | Sewell | 361/388 |
| 5,083,368 | 1/1992 | Frank | 29/840 |
| 5,089,935 | 2/1992 | Ito | 361/383 |
| 5,093,759 | 3/1992 | Davis et al. | 361/386 |
| 5,102,712 | 4/1992 | Peirce et al. | |
| 5,128,008 | 7/1992 | Chen et al. | 204/192.15 |
| 5,136,465 | 8/1992 | Benck et al. | 361/384 |
| 5,173,668 | 12/1992 | Jacobowitz et al. | 333/156 |
| 5,214,568 | 5/1993 | Heng | 361/736 |

Primary Examiner—Gopal C. Ray
Attorney, Agent, or Firm—Greer, Burns & Crain, Ltd.

[57] ABSTRACT

In the present invention, a mother board is fixed perpendicularly to the center of a support table of a system. On one side of the mother board, any number of floppy disk drives and hard disk drives are mounted. On the other side of the mother board, a power source and any number of function modules are mounted. The function modules include a CPU, a memory, an input/output controller, a communication controller, etc. Each of the function modules and units is stored in its own case. The function modules are airtight. Thus, since each unit and function module is protected in its own case, large case for covering the whole system is not required. Therefore, the units and function modules are well ventilated and have a good heat radiation effect. Each case also acts as a heat radiator and eliminates the necessity of a forcible cooling unit, and the fault rate is thus reduced.

5 Claims, 9 Drawing Sheets

COMPUTER ELECTRONIC SYSTEM HAVING A COVER FOR EVERY MODULE

This is a continuation of application Ser. No. 07/879,024, filed on May 6, 1992, now abandoned.

BACKGROUND OF THE INVENTION

The present invention relates to a high-reliability computer system, and specifically to a high-reliability computer system which has excellent durability and excellent resistance to an undesirable environment.

Recently, computer capability has been progressively improved with the increasing number of peripherals. As a result, the consumption of electric power required for operating computers has markedly increased. Additionally, according to downsizing, the size of conventional main bodies and their peripherals have been minimized and a large number of small systems are being concentrated in small areas. This increase in electric power consumption per unit and concentration of units result in increased heat generated. Therefore, forcible coolers are required for power source units and IC boards where these parts are concentrated. As shown in FIG. 1, common personal computers and mini-computers are provided with a cooling fan or an air filter. In FIG. 1, a case 1 is designed to be easily moved on four casters 10 attached to it. Inside the case, various function modules and peripherals are provided. These include a floppy disk drive 2, hard disk drives 3, a power source 4, a plurality of cards (IC board) 5, a mother board 6 for holding the cards and connecting them through buses, a card shelf 7 for storing the mother board 6 and the cards 5, and three fans O and an air filter 9 for cooling the heat generated by these modules and units.

The cards 5 comprise function modules such as a CPU (central processing unit), memories such as ROMs (read only memories) and RAMs (random access memories), an input/output controller, and a communication controller, etc. Normally, a plurality of electrical parts, mainly IC, are arranged on a printed circuit.

To cool the computer system air is first drawn into the case by the three moving fans 8 through the space formed by the four casters 10 between the bottom plate of the case 1 and the floor, and through the air filter 9 where it is purified. Then, the air removes the heat generated at each of the parts and radiates the heat the direction indicated by the arrow A.

With dust-proof FA (factory automation) personal computers, FA computers, etc., a fine filter is utilized to protect the contents of the computer system from dust in air worse and dustier than the normal atmosphere. A more powerful fan must be mounted in order to inhale outside air against the larger air resistance generated by a dust-clogged fine filter.

However, the above described forcible cooling fan normally has poor durability, and must be replaced every two or three years. This is the main reason for a short mean time to failure (MTBF) of computer systems. In an undesirable atmosphere, air filters become filled with dust very quickly, and maintenance work such as periodical checks, cleaning, replacement of parts, etc. is required every second or third month. Such maintenance work is costly, and stops the operation of the computer system during the maintenance. As a result, computer operations are often disrupted, thereby down-grading computer reliability.

With the above described dust-proof FA personal computers and FA computers, etc., there is a problem that the powerful fan is noisy, thus degrading the working environment. Besides, a fine filter fills with dust quickly, often reducing fan speed or completely stopping it. Trouble begins as a fan slowdown and leads to a degradation of cooling capability. Finally, heated parts may become badly burned. Therefore, a new device must be designed to prevent these problems. It must detect abnormal rises in the temperature inside a computer system and raise an alarm or forcibly disconnect the power source when the detected temperature exceeds a predetermined value. However, there are some problems with this new device. It is very expensive. Furthermore, when the power source is forcibly disconnected, the whole controlling operation stops and all the important data being processed is probably lost. This seriously damages the reliability of the computer system.

When a computer system is operated in an undesirable environment, it is recommended that it be sealed in an airtight container. However, there is the problem that a forcible cooling device is not compatible with an airtight structure.

SUMMARY OF THE INVENTION

An object of the present invention is to solve the above described problems, to protect the computer systems from dust, and to provide a high-reliability computer system.

The present invention can be applied to a computer system configured by connecting through a common bus a plurality of function modules forming an electronic circuit. To attain the above object, in the present invention each function module is provided with a case to isolate it from heat generated by other function modules. And, each case is mounted on a metal-core printed board to which function modules are implemented so that the heat generated by each function module can be easily radiated through its own case. Then, a case for storing a common bus is provided and connected to each function module case so that the heat led through the function module case is stored and radiated. Thus, each function module case works as a heat radiator, and the case connected to each of the function module cases also works as a heat radiator, thereby greatly improving the total heat radiating capability.

Each of the function module cases is made airtight by separately connecting it to a case for storing a common bus. Since each module is put in its own air-tight case, a large case conventionally used for storing the whole system is not required. Therefore, the system is well ventilated without an overall case, and the total heat radiating capability is further improved. Besides, the airtight structure performs a good dust-proofing function.

With the above described structure, power source functions are divided into a rectification smoothing function and a voltage stabilizing function. The rectification smoothing function commonly works on each of the function modules, and the voltage stabilizing function is individually added to each function module. The voltage stabilizing function is established as a module independent of each function module and added as the optimum voltage stabilizing module to each function module. Thus, the heat generated by the power source unit can be easily radiated, so that the number of elements to be forcibly cooled can be reduced, and the heat radiating capability can be greatly improved by radiating heat from each case. The improvement of the total heat radiating capability requires no forcible cooling units, and accordingly, no temperature detecting units or alarm units are required. Therefore, cost can be reduced and other components requiring frequent maintenance work can be omitted, thereby further improving the durability of the system.

The print boards for each function module and the mother board providing the common bus are made of metal-core print board. The case for storing each function module and common bus is made of a conductive and permeable material, and is electrically connected to the mother board and the power source ground to form an electromagnetic shield. This prevents damages to stored data and prevents erroneous operations due to a change of signals, both caused by electromagnets, static electricity, and electromagnetic waves (specifically discussed recently). In this way, the reliability or computers is greatly improved by the above described dust-proof structure and durability is prolonged.

DESCRIPTION OF THE PREFERRED EMBODIMENT

Figure 1:
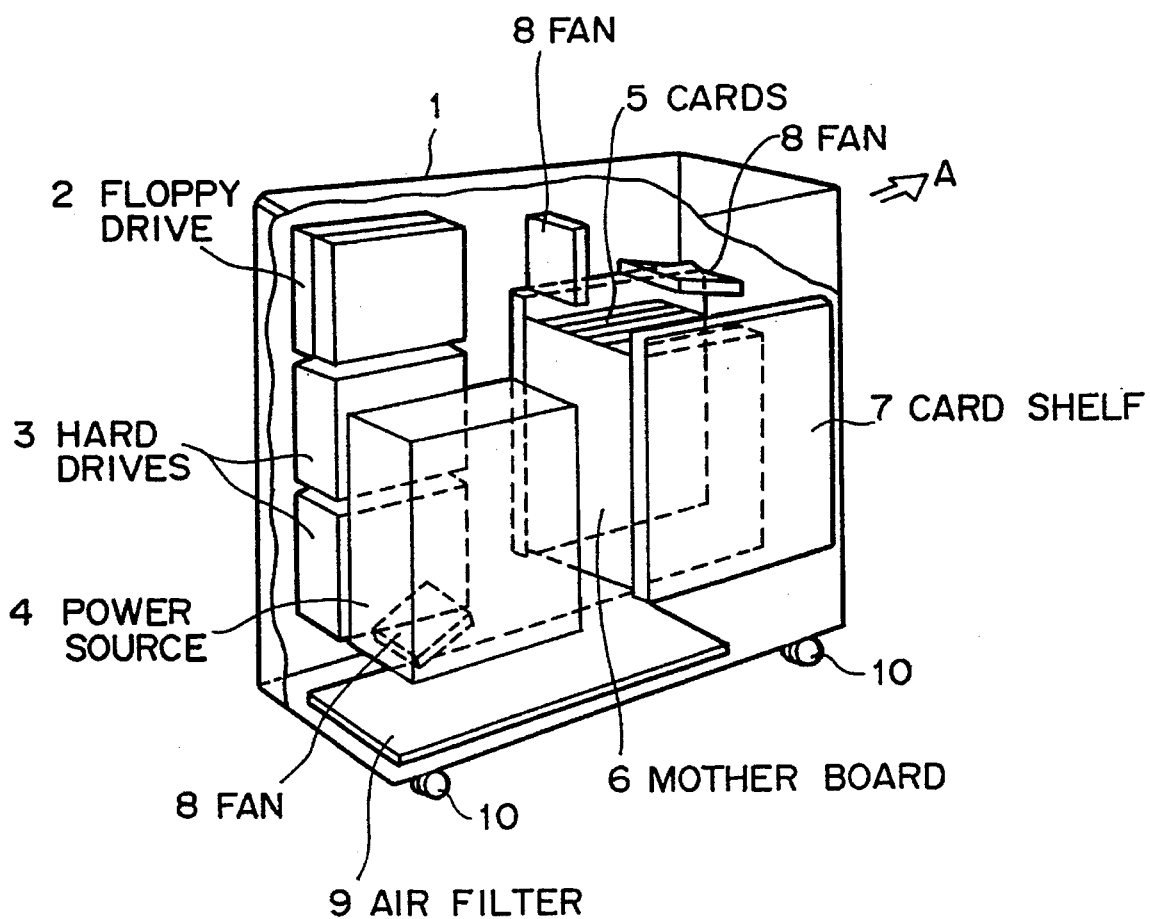
FIG. 1 is a view for illustrating a conventional computer system.
Figure 2:
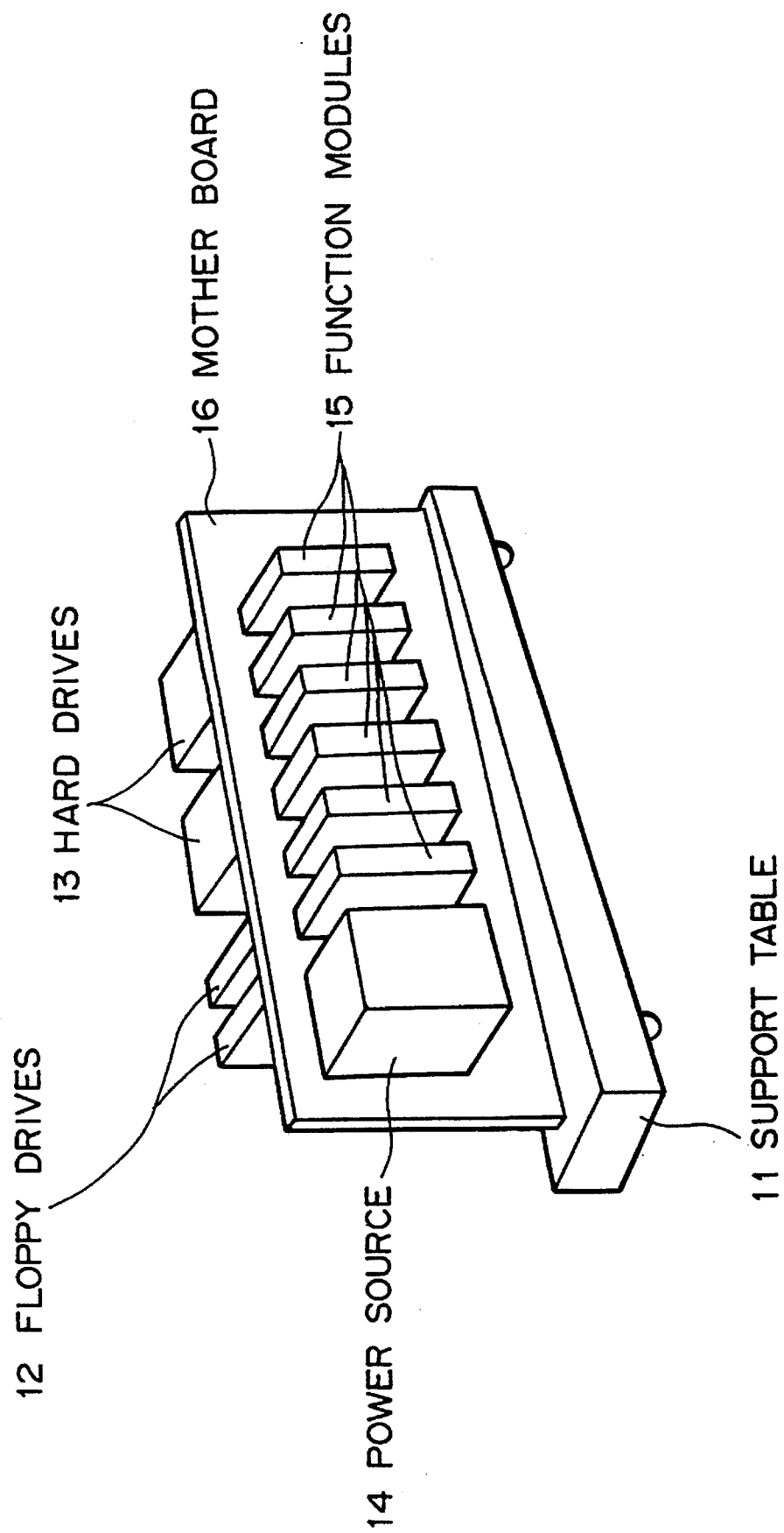
FIG. 2 is an oblique view of computer system of the first embodiment.

FIG. 2 is an oblique view of the computer system of the first embodiment of the present invention. In the configuration of the present embodiment, a mother board 16 is fixed perpendicularly onto the center of a support table 11 of a system. Two floppy disk drives 12 and two hard disk drives 13 are mounted on one side of the mother board 16. On the other side of the mother board 16, a power source 14 and six function modules 15 are mounted. The function modules 15 comprises a CPU, a memory, an input/output controller, a communication controller, etc. Each of the function modules 15, and each unit 12, 13, or 14 shown in FIG. 2 are stored in each of the cases. Specifically, each of the function modules 15 is stored in an airtight case.

Figure 3:
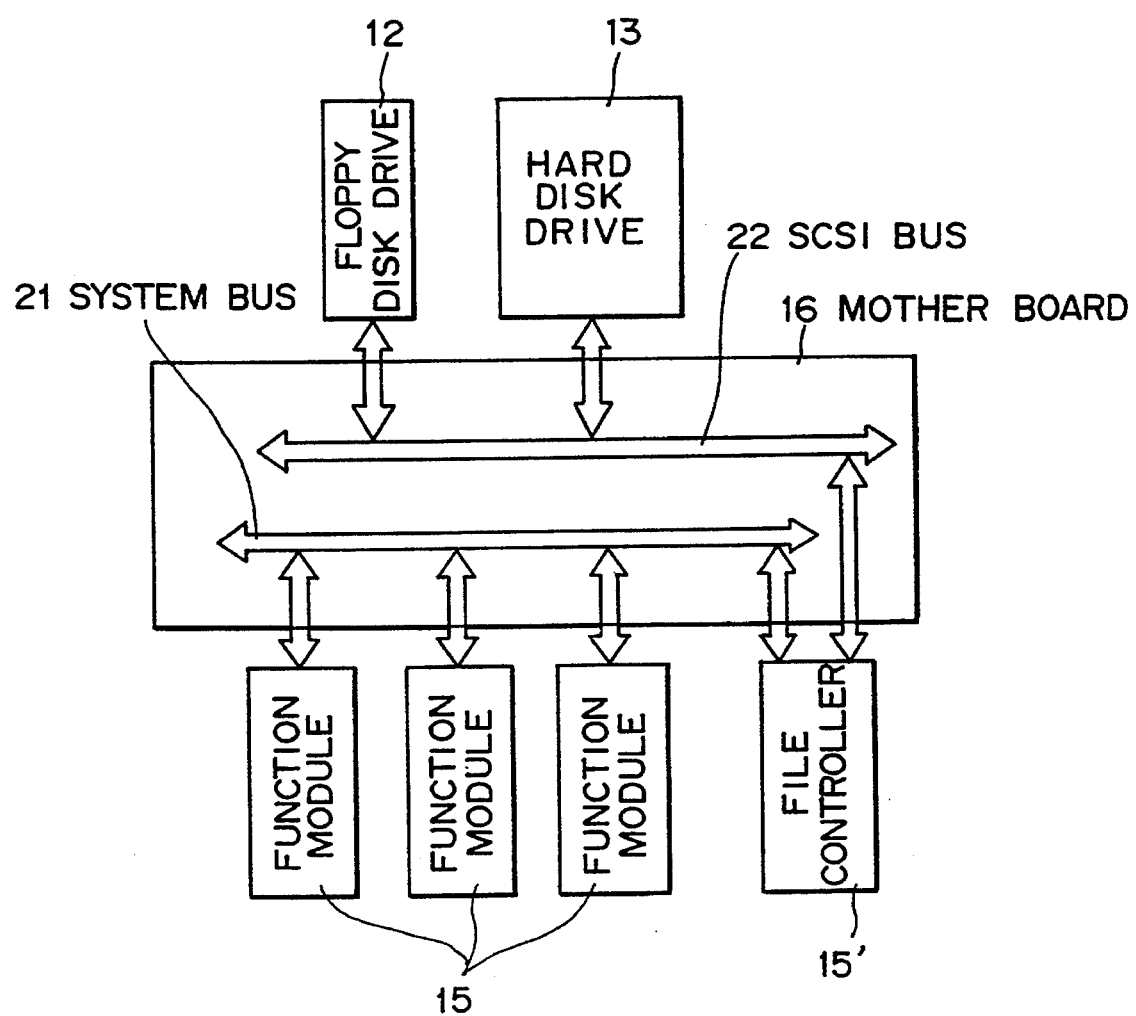
FIG. 3 is a view for illustrating how the computer system of the first embodiment is wired.

FIG. 3 is a view for illustrating how the computer system of the first embodiment is wired. As shown in FIG. 3, the components of the system are electrically connected to one another through a system bus 21 and an SCSI (small computer system interface) bus 22, which are common buses provided for the mother board 16. That is, the floppy disk drive 12 and the hard disk drive 13 are connected to the SCSI bus. Among the function modules 15, the CPU and the memory, etc. are connected to the system bus 21, and a file controller 15' is connected to both the SCSI bus 22 and the system bus 21.

Thus, the above described units 12, 13, and 14 and their cases, and the function modules 15 and their cases are mounted at predetermined intervals onto both sides of the mother board 16 perpendicularly fixed onto the support table 11 shown in FIG. 2. Therefore, the five surfaces of each of the cases of the units 12, 13, 14 and the function modules 15 are exposed to air except one surface fixed to the mother board 16, thus keeping each case well ventilated. As a result, heat is not retained around the cases of the units 12, 13, 14 and function modules 15, but is efficiently radiated, and the influence of heat on units 12, 13, and 14, and the = function modules 15 can be prevented.

Figure 4:
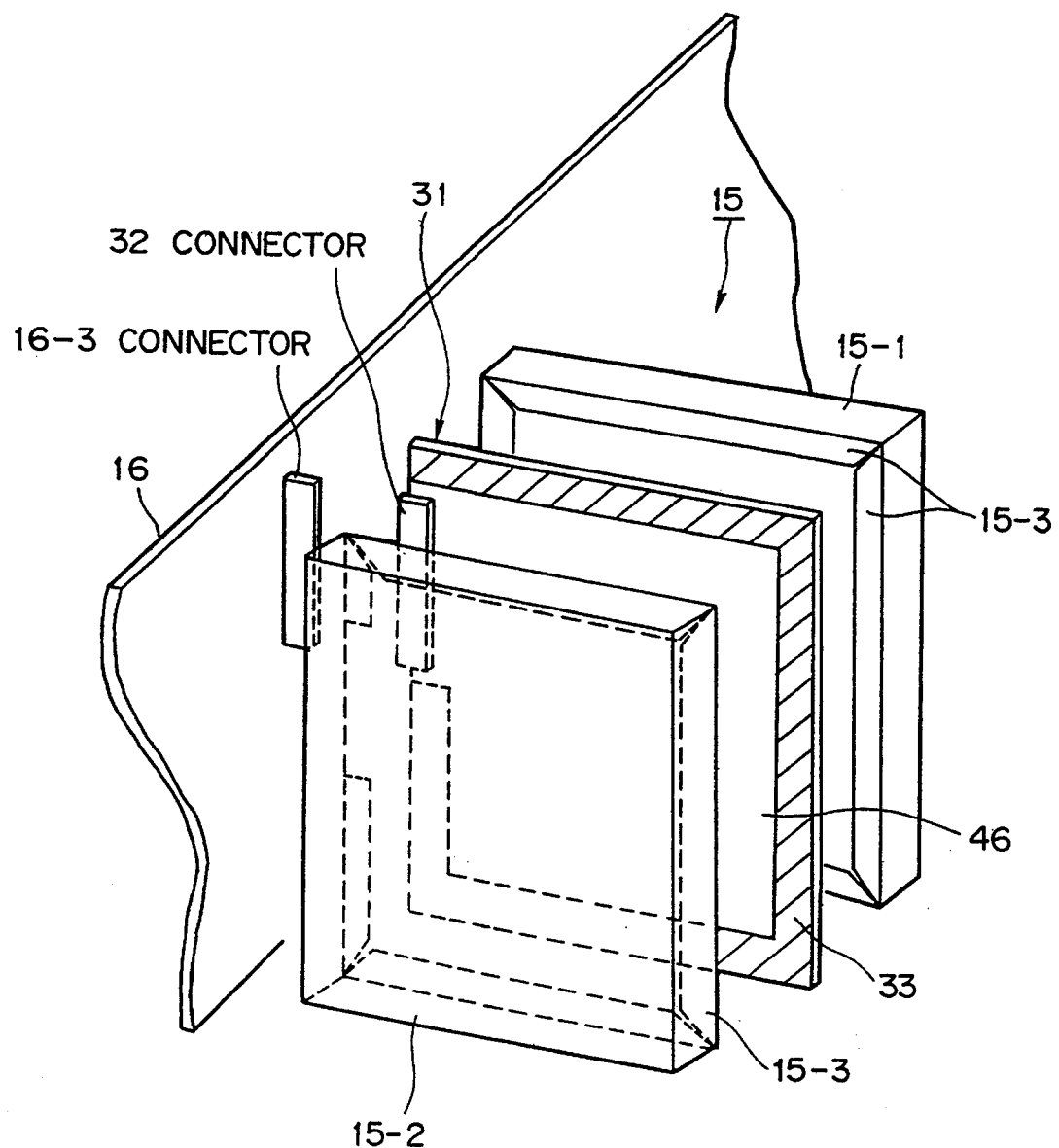
FIG. 4 is an exploded view of the second embodiment.
Figure 5:
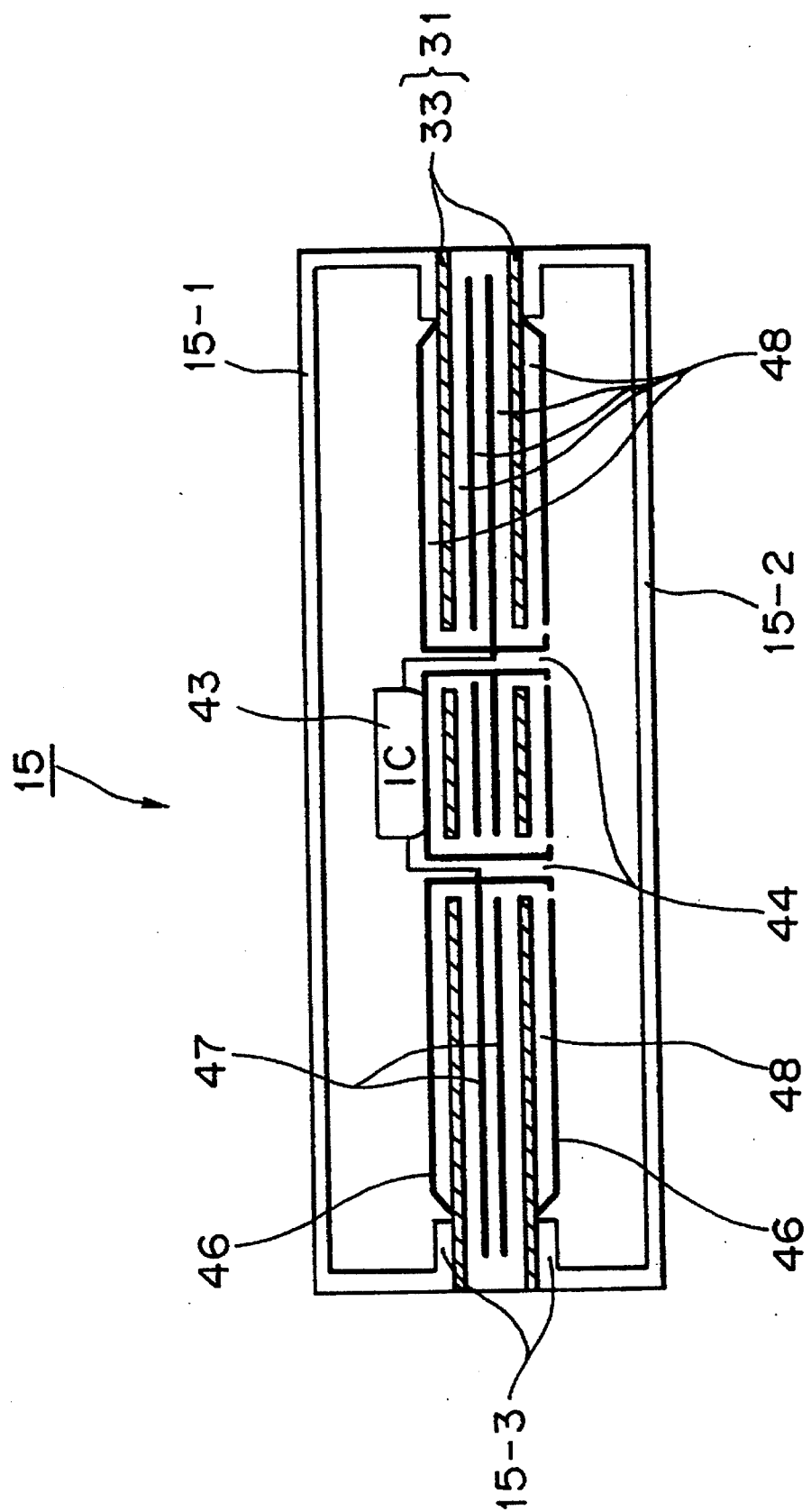
FIG. 5 is a sectional view of the second embodiment.

Next, FIG. 4 is an oblique exploded view for illustrating a configuration sample in which a metal-core printed board is used as a substrate of the above described function module and its case 15. FIG. 5 is a sectional view of the second embodiment. In both FIGS. 4 and 5, the components having the same functions as those in the first embodiments are assigned the same numbers.

FIG. 4 is a view of a function module and its case 15 exploded into three components (a metal case 15-1, a metal-core printed board 31, and a metal case 15-2), and the mother board 16 and its connector 16-3. The metal-core printed board 31 at the center of the function module and its case 15 is provided with a connector 32 for connection through the connector 16-3 of the mother board 16 to the system bus 21 on the mother board 16 (the file controller 15' shown in FIG. 3 is connected to both the SCSI bus and the system bus through its connector and another connector 16-3 of the mother board 16). A radiating metal layer 33 is made of copper, aluminum, iron, etc. having good thermal conductivity, and is contained fully in the metal-core printed board 31 and is exposed on both sides in the form of a frame of a predetermined width (shown by a diagonal portion in FIG. 4). The central part of the metal-core printed board where the metal layer 33 is not exposed is covered with an outer resin layer 46 on which are provided a plurality of implemented parts 43 comprising an electronic circuit (for example, an integrated circuit chip) shown in FIG. 5. The metal cases 15-1 and 15-2 are made of copper, aluminum, iron, etc. having good thermal conductivity, and are fixed such that they face the metal-core printed board 31 from each side, and they are hollow. In each case, there is only one opening in the plane facing the metal-core printed board, and the metal case has a frame 15-3 opposite to the exposed metal layer 33 of the metal-core printed board 31.

FIG. 5 is a sectional view of the function module and its case 15 explained by referring to FIG. 4 (in which the metal-core printed board 31, the metal case 15-1, and the metal case 15-2 are incorporated). In FIG. 5, the exposed portions of the two metal layers in the metal-core printed board 31 are closely attached to the frames 15-3 of the metal cases 15-1 and 15-2 with screws, etc.

The metal core printed board 31 has wiring pattern layers comprising two outer layers 46 on both sides, two inner layers 47, and five isolating layers 48 for isolating these four layers and the metal layers from one another. A plurality of the implemented parts 43 are provided on the outer layer 46 (only one of them is shown as an example in FIG. 5). Through-holes 44 are made to fix these implemented parts 43 through and connect them to wires in a predetermined pattern.

With the above described configuration, the heat collected from each implemented part 43 by the metal layer 33 is conducted to the frame 15-3 of the metal cases 15-1 and 15-2, and is radiated into the air by these cases. A hot spot (at which a local temperature rise on a printed board) is thus prevented.

The configuration of the above described four wiring pattern layers, and two metal layers is not limited to this application, but the metal layer can be optionally defined as a one- or three-layer structure. The number of layers in the wiring pattern can also be defined optionally.

Figure 6:
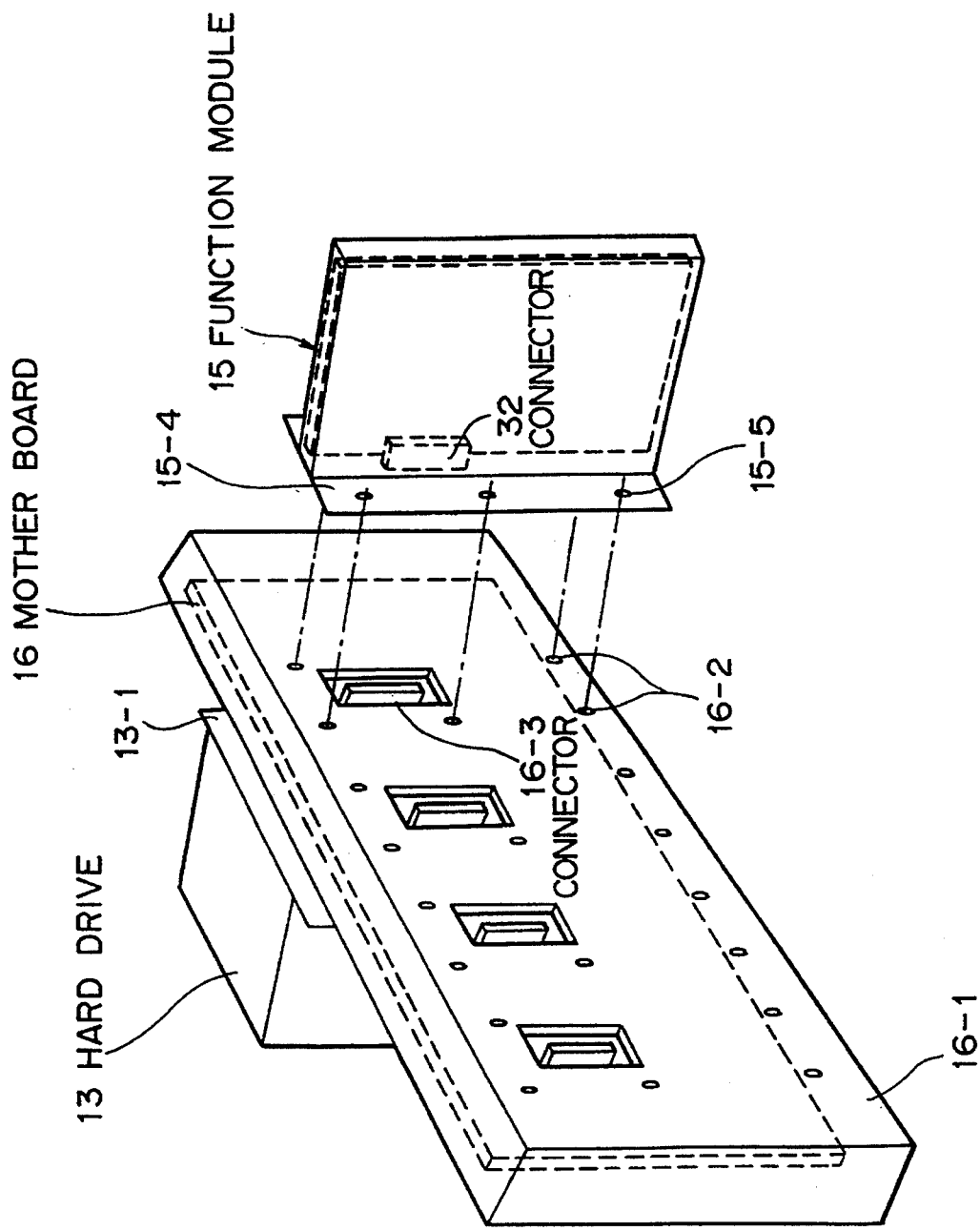
FIG. 6 is an oblique view for illustrating the configuration of the third embodiment.

FIG. 6 shows the third embodiment. In FIG. 6, components having the same function as those in the first and second embodiments are assigned the same numbers. The mother board 16 is stored in an exclusive case 16-1, and each unit such as the hard disk drive 13, etc. (other units are not shown in FIG. 6) and the function module and its case 15 (only one of the modules is shown as an example in FIG. 6) are mounted in the case 16-1. The function module and its case 15 is provided with a flange 15-4 for both fixing a unit and effectively conducting heat. Likewise, each unit such as the hard disk drive 13, etc. is provided with a flange 13-1, etc. having the same properties. These flanges 15-4 and 13-1, etc. are positioned in the case 16-1 by screw holes 15-5 and 16-2, and fixed with screws, etc. The case 16-1 of the mother board 16 is provided with openings for connectors 16-3, connected to a system bus 21 or an SCSI bus 22 provided for the mother board 16, and each of the connectors 16-3 and the corresponding connector 32 of a function module and its case 15 are coupled and electrically connected in the airtight space by combining their cases.

In the above configuration, the heat generated by the implemented parts 43 shown in FIG. 5 is conducted to the case 16-1 for storing the mother board 16 through the metal layer 33, the metal frame 15-3, the metal cases 15-1 and 15-2, and the flange 15-4 shown in FIG. 6, and then radiated with improved radiating configuration. Since each unit and function module, etc. is enclosed in an airtight case, the system can be operated in an undesirable environment full of dust, etc. It is needless to say that each unit and function module etc. are mounted so that the optimum heat radiation can be obtained according to the calculation of the power consumption of each unit and function module, that is, the amount of heat generated and the amount of heat radiated through the metal core and the cases.

Figure 7:
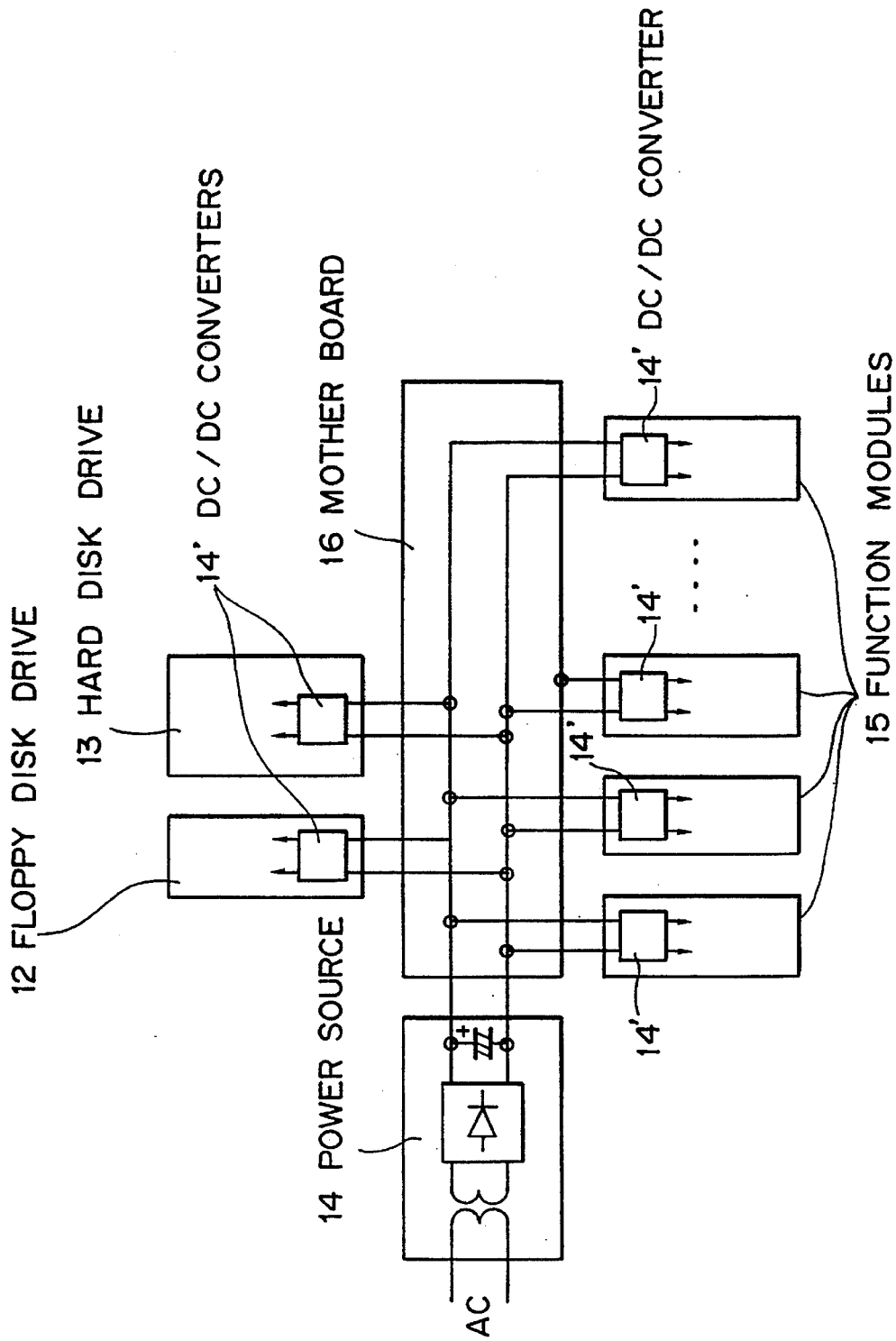
FIG. 7 is a plan view for illustrating the configuration of the fourth embodiment.

FIG. 7 shows the fourth embodiment. This embodiment divides the function of a power source unit indicating the largest amount of heat generation in a computer system into a rectification smoothing function and a voltage stabilizing function. Then, it uses the rectification smoothing function as a common function, and further divides the voltage stabilizing function for each unit and function module. FIG. 7 shows a view for showing the first embodiment using the above voltage stabilizing function. In FIG. 7, the power source 14 has only the rectification smoothing function unlike the first embodiment. For example, a direct current voltage "+24V" prior to the voltage stabilization is applied. The voltage stabilizing function provided by a DC/DC converter 14' for practically providing electric power (voltage) is assigned after being distributed to each disk drive unit 12, 13, and function module 15, and connected to the output side of the rectification smoothing function of the power source 14 through the mother board 16.

Thus, the amount of heat generated by the power source 14 can be reduced more than before by dividing the function of the power source unit. Each of the distributed converters 14' is assigned to the metal core printed board of the function modules, and the generated heat is radiated individually, thereby radiating the heat more easily than by the conventional power source method in which the rectification function and the voltage stabilizing function are performed as one function. In this case, each of the DC/DC converters 14' is designed to provide the optimum stabilized voltage for each unit and function module.

In the present embodiment, when each unit and function module is extended, its power source (voltage stabilizing function) can be additionally extended. Therefore, it is not necessary to prepare a large capacity power source for an extension as in the conventional function-centralized power source method. As a result, cost can be greatly reduced. Furthermore, a fault in one power source, that is, a fault in one voltage stabilizing function (DC/DC converter), does not stop the system, and the system's operation can thus be greatly stabilized. Besides, the power source 14 in FIG. 7 has a simple circuit configuration, and less faults are expected. Accordingly, the MTBF can be extended further in the conventional function-centralized method.

The above described voltage stabilizing function distributed for each unit and function module can be established as an independent module without being assigned to the metal-core printed board.

Figure 8:
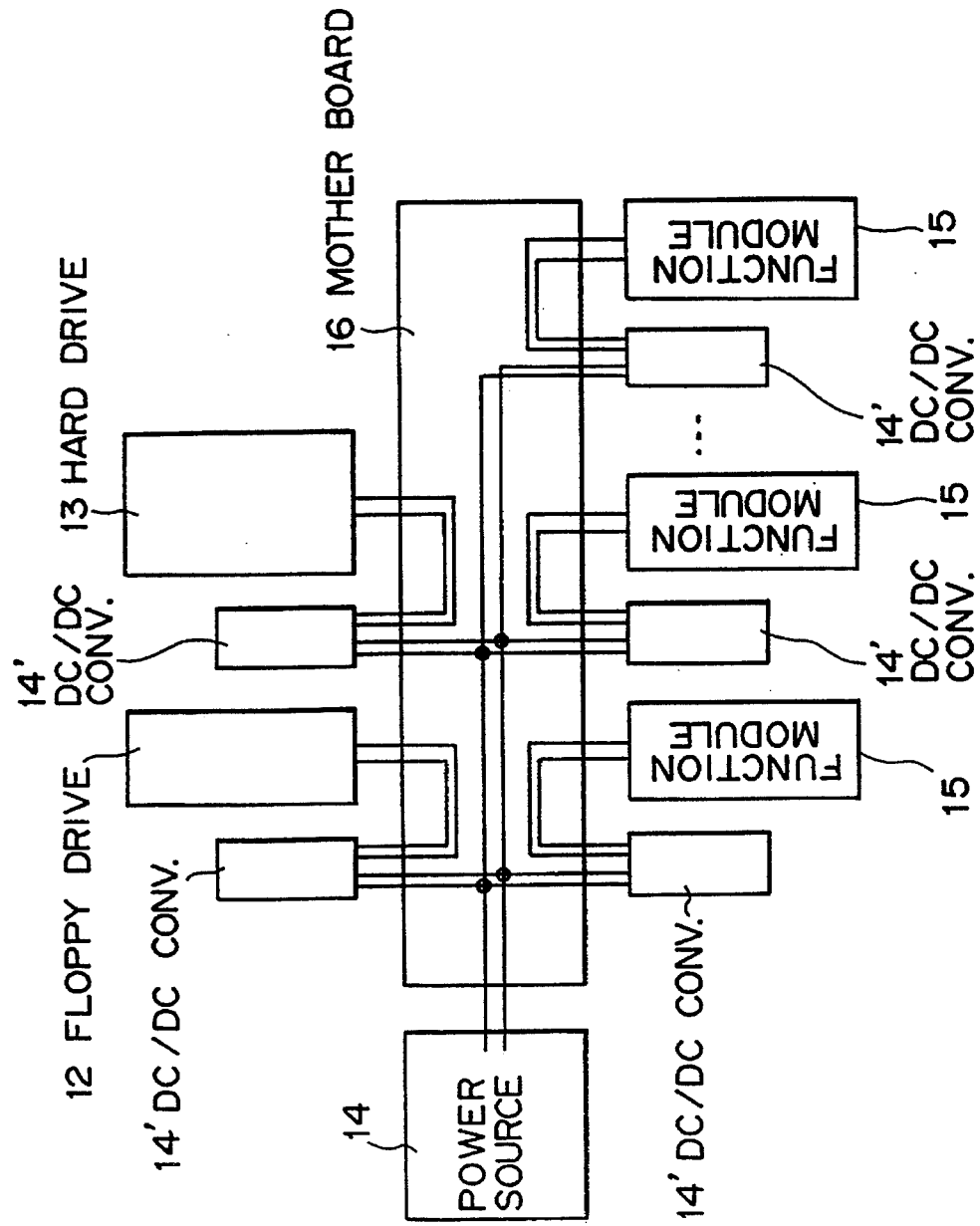
FIG. 8 is a plan view for illustrating the configuration of the fifth embodiment.

FIG. 8 shows this application as the fifth embodiment. As shown in FIG. 8, an independent module of each DC/DC converter 14' is assigned adjacent to the corresponding disk drive units 12, 13, and function module 15. The independent module of the DC/DC converter 14' is connected to the power source 14 and to the corresponding unit and function module through the mother board 16.

In the present embodiment, since the voltage stabilizing function is established in the independent module of each DC/DC connector 14', heat can be radiated individually from each unit and function module, thus making heat radiation easier. Additionally, since the voltage stabilizing function is established in an independent module, an appropriate module can be selected from among the standardized voltage stabilizing modules. Therefore, a step of designing the optimum function for each metal-core printed board as in the assignment of each function onto the metal-core printed board can be skipped, thereby simplifying the configuration of the system.

The mother board 16 stored in the case 16-1 shown in FIG. 6 is made of a metal-core printed board and is provided with a ground connection portion to obtain a heat radiation effect and electromagnetic shield effect. This configuration of the fifth embodiment is shown in FIG. 9.

Figure 9:
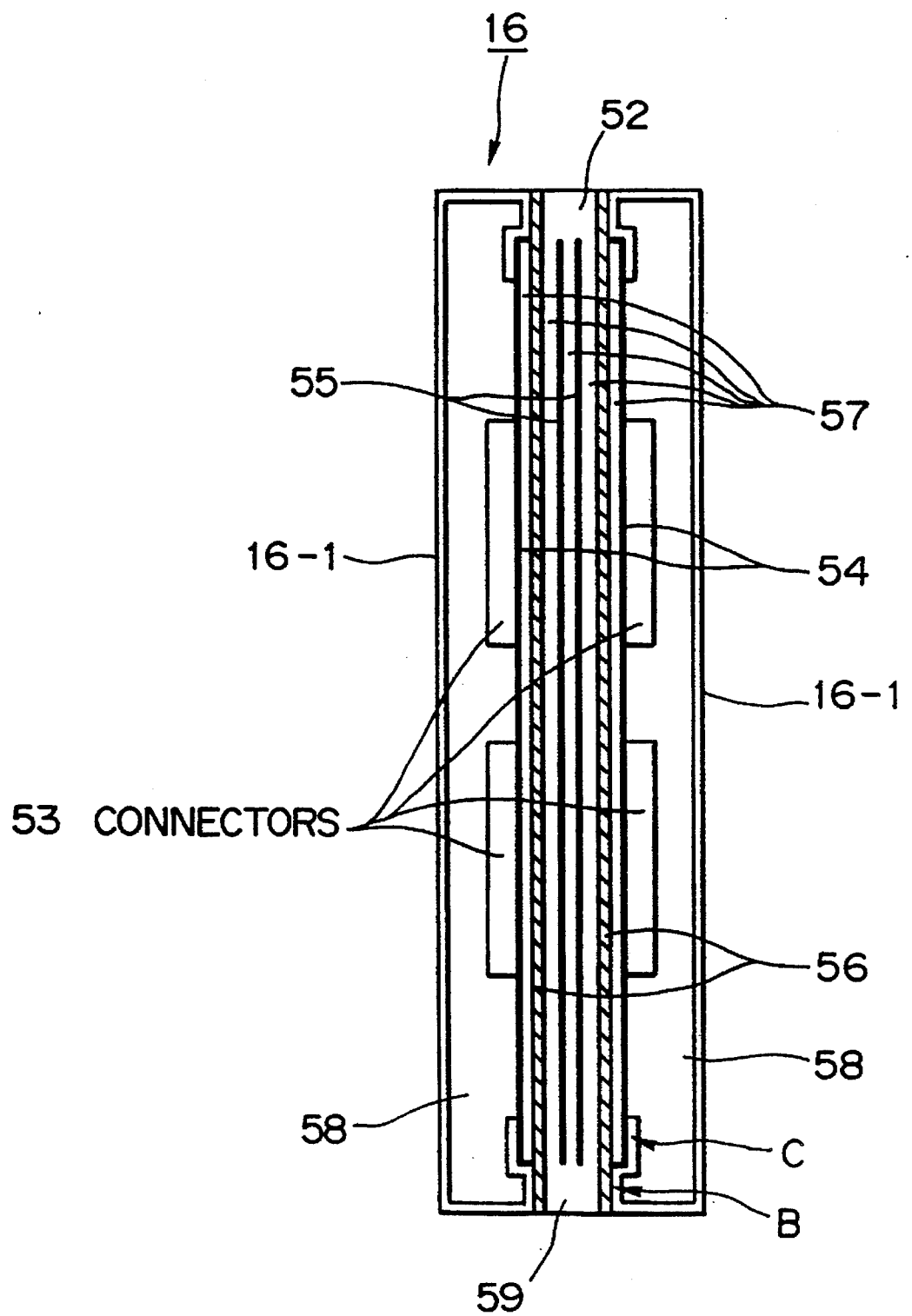
FIG. 9 is a sectional view of the sixth embodiment.

FIG. 9 is a longitudinal section of the mother board 16 shown in FIG. 6, illustrating the configuration above. In FIG. 9, the mother board 16 comprises a metal-core printed board 52 and two metal cases 16-1 each mounted to face the metal-core printed board 52 on each side. The metal-core printed board 52 is provided with two inner layers 55 (a wiring pattern layer and a power source layer), two outer layers 54 (ground layers), and two metal layers 56. Each layer is isolated from one another by an isolating layers 57. Connectors 53 are mounted on both sides of the metal-core printed board 52 (outside the two outer layers 54), and connected to a predetermined position of the bus of the inner layers 55 and the outer layers 54. A metal layer 56 is exposed at the circumference of the metal-core printed board 52, and is closely attached to the circumference of each case 16-1 as indicated by arrow B in FIG. 9. Likewise, the circumference of the outer layer 54 is closely attached to the circumference of each case 16-1 as indicated by arrow C in FIG. 9.

With the above configuration, an excellent heat radiation effect can be obtained through the connection indicated by arrow B in FIG. 9, as with the function module 15 shown in FIG. 5. The metal case 16-1 is connected to the outer layer 54 (a ground layer) through the connection indicated by arrow C in FIG. 9, and thus the metal layer 56, the outer layer (a ground layer) 54, and the metal case 16-1 become electrically connected. Thus, two areas 58 surrounded by two layers 54 and two metal cases 16-1 and one area 59 surrounded by two metal layers 56 are electromagnetically shielded.

The mother board 16 in the present embodiment is described in detail. The same effect can be obtained with the function modules and their cases 15 or units and their cases 12 and 13 shown in FIG. 5. A computer system having a further improved electromagnetic shield effect can be configured by combining the above parts appropriately.

First, in the present invention, a separate case provided for each function module isolates heat from the others. Additionally, since each case protects its own function module from environmental conditions, an overall case for housing the whole system is not required, the air is not stagnant in the system case, each of the separate cases is well ventilated around it, and heat is effectively radiated from each function module.

Second, the heat conductive performance from a function module to a case is improved by having the case connected to a metal-core printed board to which a function module is implemented. Therefore, the heat radiation effect can be further improved by each case acting as a heat radiator.

Third, a case provided for each function module and attached to a case containing a common bus further improves the heat radiation effect because the case containing the common bus in addition to the separate cases of function modules acts as a common heat radiator.

Fourth, since the case provided for each function module and attached to the case of the common bus is made airtight, the system can be located in an undesirable environment where it is often subject to corrosive gases, and the system will be resistant to the undesirable environment.

Fifth, the power source function is divided into a rectification smoothing function and a voltage stabilizing function, and the voltage stabilizing function is independently added to each function module. Therefore, the heat generated by the power source is radiated without being stagnant at one area. Thus, the heat radiation effect can be improved and a thermal influence is prevented from being imparted to one another.

As described above, the improvement of the heat radiation effect by the heat radiation of each case eliminates the necessity of a forcible cooling unit, a temperature detector, an alarm unit, etc. As a result, cost can be reduced and a component requiring frequent maintenance work can be omitted, thus be greatly improving durability and ensuring a high-reliability computer system.

In the present invention, each module can easily be made air-tight and resistant to an undesirable environment, thereby greatly reducing the fault rate. Thus, a high-reliability computer system is realized.

Sixth, a case is made for storing a function module or a common bus of a conductive and permeable material, electrically connected to another case, and then connected to a power source ground to form an electromagnetic shield, thus realizing a high-reliability computer system, free of data loss and free of erroneous operations due to a change of a signal caused by electromagnetic waves which have often caused problems recently.

The present invention has been described by referring to embodiments and their modifications. It is obvious that other embodiments, various applications, and modifications involved are included in the scope of the present invention.

What is claimed is:

1. A computer system comprising:

a plurality of function modules, each having an electronic circuit, for performing an electronic function, and each having a metal-core printed circuit board including a metal layer for collecting the heat generated by the corresponding function module, said metal layer of said metal-core printed circuit board having a disposed peripherally exposed portion, a mother board containing a bus and a connector for connecting said plurality of function modules, a plurality of cases, each made of a thermally conductive metallic material, each said case containing and fully enclosing one of said plurality of function modules, for isolating the interference of heat from one another, each of said cases including a frame portion which corresponds to said exposed metal portion of said metal layer, said frame portion being securely attached to said exposed metal portion such that heat generated in said function module radiates through said case and also to ambient from said exposed portion of said circuit board, a metallic, thermally conductive mother board case enclosing said mother board and having at least one outer side surface, wherein each of said cases for said function modules is connected to one of said outer side surfaces which collects and radiates heat conducted through said cases of said function modules, rectification smoothing means provided for a power source, commonly working on each of said plurality of function modules for providing rectified power to each of said plurality of function modules, and voltage stabilizing means provided for the power source and independently added to each of said plurality of function modules for stabilizing voltage of said rectified power supplied to each of said plurality of function modules.

2. A computer system according to claim 1, wherein both sides of edges of a predetermined width of said metal layer are exposed; and each of said cases is provided with a frame part connected to a circumferential metal part of said metal-core printed circuit board, and radiates the heat generated by the corresponding function module; said-metal core printed circuit board is provided with a connector extending from a portion at said circumferential metal part;

said frame part being connected to said circumferential metal part over the entire circumference thereof except the portion from which said connector extends.

3. A computer system according to claim 1, wherein an opening side of each of said cases containing said function modules is connected to an opening part of said case containing said mother board to keep each of said function modules in an airtight condition.

4. A computer system comprising:

a plurality of function modules, each having an electronic circuit for performing an electronic function, and each having a metal-core printed circuit board including a metal layer for collecting the heat generated by the corresponding function module, said metal layer of said metal-core printed circuit board having a peripherally located exposed portion, a mother board including a bus and a connector for connecting said plurality of function modules, a plurality of metallic cases, each made of a thermally conductive material, each said case fully enclosing one of said plurality of function modules, for isolating the interference of heat from one another, each of said cases including a frame portion which is tightly secured to said peripherally located exposed metal portion of said metal layer so as to be tightly secured in an overlapping relationship such that the heat generated in said function module radiates through each said case, a mother board case enclosing said mother board and being made of a thermally conductive metallic material, wherein each of said cases for said function modules is connected to one of said outer side surfaces, and collects and radiates heat conducted through said cases of said function modules, each function module among said plurality of function modules comprises a connector by which each of the printed circuit boards of said plurality of function modules are electrically connected to said mother board and a screwing flange by which each of the printed circuit boards of said plurality of function modules are connected to a lower-case of said mother board for thermal conduction, each of said cases containing said function modules are electrically connected to said mother board, and then connected to a power source ground to form an electromagnetic shield, rectification smoothing means provided for a power source, commonly working on each of said plurality of function modules for providing rectified power to each of said plurality of function modules, and voltage stabilizing means provided for the power source and independently added to each of said plurality of function modules for stabilizing voltage of said rectified power supplied to each of said plurality of function modules.

5. An enclosed printed circuit board onto which an individual function module of a computer system is mounted, comprising:

a metal-core printed circuit board having at least one internal metal-core for radiating heat, a part of said metal-core being exposed at the circumference of said metal-core printed circuit board, a case enclosing said metal-core printed circuit board, said case being divided at the center into two parts each being provided with a frame, said frame contacting said part of said exposed metal-core which is exposed by enclosing said metal-core printed circuit board by said two parts at said circumference, said case conducting the heat generated by said function module by radiation, and a voltage stabilizing means independently added to said function module for stabilizing voltage of rectified power supplied to said function module from a central power source, said central power source including rectification smoothing means for providing said rectified power as said electric power to said function module.

* * * * *

UNITED STATES PATENT AND TRADEMARK OFFICE
CERTIFICATE OF CORRECTION

PATENT NO. : 5,497,495
DATED : March 5, 1996
INVENTOR(S) : Ishikawa

It is certified that error appears in the above-indentified patent and that said Letters Patent is hereby corrected as shown below:

Column 1, line 33, delete "fans 0" and insert --fans 8--.

Column 4, line 6, delete "=".

Column 6, line 26, delete "connector" and insert --converter--.

Column 6, line 49, delete "layers" and insert --layer--.

Signed and Sealed this

Tenth Day of June, 1997

BRUCE LEHMAN

*Attest:*

*Attesting Officer*       Commissioner of Patents and Trademarks